US011995278B2

(12) United States Patent
Wang et al.

(10) Patent No.: US 11,995,278 B2
(45) Date of Patent: May 28, 2024

(54) TOUCH SENSING ASSEMBLY AND TOUCH SENSING DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Jieping Wang, Wuhan (CN); Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/262,707

(22) PCT Filed: Aug. 24, 2020

(86) PCT No.: PCT/CN2020/110728
§ 371 (c)(1),
(2) Date: Mar. 27, 2023

(87) PCT Pub. No.: WO2022/011784
PCT Pub. Date: Jan. 20, 2022

(65) Prior Publication Data
US 2023/0214069 A1 Jul. 6, 2023

(30) Foreign Application Priority Data
Jul. 14, 2020 (CN) .......................... 202010677111.1

(51) Int. Cl.
*G09G 5/00* (2006.01)
*G06F 3/041* (2006.01)
(Continued)

(52) U.S. Cl.
CPC .......... *G06F 3/0445* (2019.05); *G06F 3/0412* (2013.01); *H10K 59/40* (2023.02);
(Continued)

(58) Field of Classification Search
CPC ................. G06F 3/0445; G06F 3/0412; G06F 2203/04111; G06F 2203/04112; H10K 59/40
(Continued)

(56) References Cited

U.S. PATENT DOCUMENTS

2013/0127775 A1* 5/2013 Yilmaz ................. G06F 3/0446
 200/600
2017/0160830 A1 6/2017 Lee
(Continued)

FOREIGN PATENT DOCUMENTS

CN 102662544 A 9/2012
CN 108415629 A 8/2018
(Continued)

OTHER PUBLICATIONS

International Search Report in International application No. PCT/CN2020/110728, dated Apr. 15, 2021.
(Continued)

*Primary Examiner* — Jennifer T Nguyen
(74) *Attorney, Agent, or Firm* — PV IP PC; Wei Te Chung; Zhigang Ma

(57) ABSTRACT

The present application provides a touch sensing assembly and a touch sensing display device. The touch sensing assembly includes a touch sensing layer. By disposing the first connecting branch electrode between the second branch electrode and the second main electrode, transmission channels of current in the second direction in each of the touch sensing units is increased, thereby reducing the impedance of the second touch electrode in each touch unit. In addition,
(Continued)

each of the second branch electrodes surrounds one of the first branch electrodes to increase the mutual capacitance between the first branch electrode and the second branch electrode.

16 Claims, 5 Drawing Sheets

(51) Int. Cl.
    *G06F 3/044*     (2006.01)
    *H10K 59/40*     (2023.01)

(52) U.S. Cl.
    CPC ............ *G06F 2203/04111* (2013.01); *G06F 2203/04112* (2013.01)

(58) Field of Classification Search
    USPC .......................................................... 345/173
    See application file for complete search history.

(56) References Cited

U.S. PATENT DOCUMENTS

| | | | |
|---|---|---|---|
| 2018/0224968 A1* | 8/2018 | Church | G06F 3/0448 |
| 2019/0064960 A1* | 2/2019 | Na | H10K 77/111 |
| 2019/0317642 A1* | 10/2019 | Moseley | G06F 3/0448 |

FOREIGN PATENT DOCUMENTS

| | | |
|---|---|---|
| CN | 109426306 A | 3/2019 |
| CN | 110737360 A | 1/2020 |
| CN | 110989875 A | 4/2020 |
| CN | 212460535 U | 2/2021 |

OTHER PUBLICATIONS

Written Opinion of the International Search Authority in International application No. PCT/CN2020/110728, dated Apr. 15, 2021.

* cited by examiner

TOUCH SENSING ASSEMBLY AND TOUCH SENSING DISPLAY DEVICE

BACKGROUND OF INVENTION

Field of Invention

The present application relates to the field of touch sensing technology, and in particular to a touch sensing assembly and a touch sensing display device.

Description of Prior Art

Capacitive touch sensing screens are widely used in various electronic interactive scene devices due to their high durability, long service life, and support for multi-touch sensing functions. The capacitive touch sensing screen detects a change in capacitance at a position where a finger touches to detect a specific position touched by the finger.

At present, material of the touch sensing electrode is usually a hollow metal mesh material, and its actually effective conductive area is relatively small compared with the traditional entire-surfaced transparent indium tin oxide (ITO) touch sensing electrode, so a mutual capacitance between a driving electrode TX and a sensing electrode RX of the touch sensing electrode is very small, resulting in a smaller change in capacitance when a finger touches it, such that the change in capacitance is not easy to be detected by a touch sensing IC.

Therefore, there is a need to propose a technical solution to solve the problem of small mutual capacitance between the driving electrode and the sensing electrode of the touch sensing electrode.

SUMMARY OF INVENTION

Technical Problem

An object of the present application is to provide a touch sensing assembly and a touch sensing display device to increase the mutual capacitance between the driving electrode and the sensing electrode in each of the touch sensing units, and reduce impedance of one of the driving electrode or the sensing electrode in each of the touch sensing units, such that a touch sensing report rate of the touch sensing display device is improved.

Solution to Technical Problem

Technical Solution

A touch sensing assembly, including a touch sensing layer, wherein the touch sensing layer includes a plurality of touch sensing units, and each of the touch sensing units includes:
  a first touch sensing electrode arranged along a first direction, the first touch sensing electrode including: a first main electrode arranged along the first direction and at least one first branch electrode, wherein an end of the first branch electrode is electrically connected to the first main electrode;
  a second touch sensing electrode arranged along a second direction, the second touch sensing electrode including: a second main electrode arranged along the second direction, at least one second branch electrode, and at least one first connecting branch electrode, wherein an end of the second branch electrode is electrically connected to the second main electrode, opposite ends of the first connecting branch electrode are respectively electrically connected to the second branch electrode and the second main electrode, the second branch electrode surrounds corresponding one of the at least one first branch electrode, and the first direction is different from the second direction.

In the touch sensing assembly, in a same one of the touch sensing units, a first hollow portion is defined in a first region surrounded by corresponding ones of the first connecting branch electrode, the second main electrode, and the second branch electrode, and a first dummy electrode is disposed in the first hollow portion.

In the touch sensing assembly, the second touch sensing electrode in one of the touch sensing units further includes: a second connecting branch electrode, one end of the second connecting branch electrode is electrically connected to a corresponding one of the second branch electrode, and an opposite end of the second connecting branch electrode is electrically connected to an end of another second connecting branch electrode in an adjacent one of the touch sensing units in the second direction.

In the touch sensing assembly, in adjacent ones of the touch sensing units along the second direction, a second hollow portion is defined in a second region surrounded by corresponding ones of the second connecting branch electrode and the second branch electrode, and a second dummy electrode is disposed in the second hollow portion.

In the touch sensing assembly, an end of the second branch electrode away from an opposite end of the second branch electrode connected to the second main electrode is electrically connected to an end of another second branch electrode in an adjacent one of the touch sensing units in the second direction.

In the touch sensing assembly, in a same one of the touch sensing units, a third hollow portion is defined in a third region surrounded by corresponding ones of the first connecting branch electrode, the second connecting branch electrode, the second main electrode, and the second branch electrode, and a third dummy electrode is disposed in the third hollow portion.

In the touch sensing assembly, in adjacent ones of the touch sensing units along the first direction, a fourth hollow portion is defined in a fourth region surrounded by corresponding ones of the second branch electrode and the first main electrode, and a fourth dummy electrode is disposed in the fourth hollow portion.

In the touch sensing assembly, an end of the second branch electrode away from the second main electrode is insulated from an end of another adjacent second branch electrode in an adjacent one of the touch sensing units in the first direction.

In the touch sensing assembly, the first main electrode includes: a plurality of first widened portions and a plurality of first connecting portions electrically connected to the first widened portions;
  the first branch electrode includes: a plurality of second widened portions and a plurality of second connecting portions electrically connected to the second widened portions; and
  the second branch electrode surrounds corresponding ones of the second widened portions and corresponding ones of the second connecting portions.

In the touch sensing assembly, in the first main electrode, a width of each of the first widened portions close to an intersection between the first branch electrode and the first main electrode is smaller than a width of each of the first widened portions away from the intersection between the first branch electrode and the first main electrode.

In the touch sensing assembly, the first connecting branch electrode is disposed corresponding to one of the second widened portions of the first branch electrode adjacent to the first connecting branch electrode.

In the touch sensing assembly, one end of the first branch electrode is electrically connected to an intersection between the first main electrode and the second main electrode, and an included angle α between the first branch electrode and the first main electrodes satisfies 0°<α<90°; and an end of the second branch electrode is electrically connected to an intersection between the second main electrode and the first main electrode, and an included angle β between the second branch electrode and the second main electrode satisfies 0°<β<90°.

In the touch sensing assembly, the first direction is perpendicular to the second direction, and the included angle α between the first branch electrode and the first main electrode is 45°, the included angle β between the second branch electrode and the second main electrode is 45°.

In the touch sensing assembly, the first touch sensing electrode is mirror-symmetrical with respect to the first main electrode, and the second touch sensing electrode is mirror-symmetrical with respect to the second main electrode.

In the touch sensing assembly, parts of the first main electrode disposed on opposite sides of the intersection between the first main electrode and the second main electrode are connected to each other by a third connecting portion;

parts of the second main electrode disposed on opposite sides of the intersection between the first main electrode and the second main electrode are connected to each other by a fourth connecting portion; and the fourth connecting portion includes two connecting bridges that are not connected to each other, and the third connecting portion is insulated from the fourth connecting portion.

A touch sensing display device, including the touch sensing assembly according to claim 1 and a display panel, wherein touch sensing assembly is disposed on one side of the display panel, the display panel includes an organic light-emitting diode array layer and an encapsulation layer, and the encapsulation layer is located between the organic light-emitting diode array layer and the touch sensing assembly.

Advantageous Effect of Present Disclosure

Advantageous Effect

The present application provides a touch sensing assembly and a touch sensing display device, wherein touch sensing assembly includes a touch sensing layer, the touch sensing layer includes a plurality of touch sensing units, and each of the touch sensing units includes: a first touch sensing electrode arranged along a first direction, the first touch sensing electrode including: a first main electrode arranged along the first direction and at least one first branch electrode, wherein an end of the first branch electrode is electrically connected to the first main electrode; a second touch sensing electrode arranged along a second direction, wherein the second touch sensing electrode includes: a second main electrode arranged along the second direction, at least one second branch electrode, and at least one first connecting branch electrode, wherein an end of the second branch electrode is electrically connected to the second main electrode, opposite ends of the first connecting branch electrode are respectively electrically connected to the second branch electrode and the second main electrode, the second branch electrode surrounds corresponding one of the at least one first branch electrode, and the first direction is different from the second direction. By disposing the first connecting branch electrode between the second branch electrode and the second main electrode, transmission channels of current in the second direction in each of the touch sensing units is increased, thereby reducing the impedance of the second touch electrode in each touch unit. In addition, each of the second branch electrodes surrounds one of the first branch electrodes to increase the mutual capacitance between the first branch electrode and the second branch electrode, thereby reducing the impedance of the second electrode of each of the touch sensing units and increasing the mutual capacitance of each of the touch sensing units, which is beneficial to improve the touch sensing report rate of the touch sensing display device.

Figure 1:
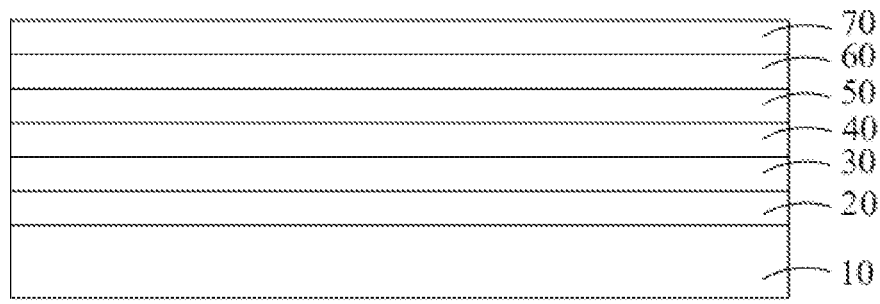
FIG. 1 is a schematic diagram of a touch sensing display device according to the present application.

Elements in the drawings are designated by reference numerals listed below.

10 substrate; 20 thin-film transistor array layer; 30 organic light-emitting diode array layer; 40 encapsulation layer; 50 touch sensing layer; 60 polarizer; 70 protective cover plate; 501 first touch sensing electrode; 5011 first main electrode; 50111 first widened portion; 50112 first connecting portion; 5012 first branch electrode; 50121 second widened portion; 50122 second connecting portion; 5013 third connecting portion; 502 second touch sensing electrode; 502a first hollow portion; 502b second hollow portion; 502c third hollow portion; 502d fourth hollow portion; 5021 second main electrode; 5022 second branch electrode; 5023 first connecting branch electrode; 5024 second connecting branch electrode; 5025 fourth connecting portion; 503 first lead; 504 second lead; 505 touch sensing unit; 5061 first dummy electrode; 5062 second dummy electrode; 5063 third dummy electrode; 5064 fourth dummy electrode.

EMBODIMENTS OF INVENTION

Invention Implementation

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Referring to FIG. 1, which is a schematic diagram of the touch sensing display device according to the present application. The touch sensing display device may be a flexible foldable touch sensing display device or a rigid touch sensing display device. The touch sensing display device includes a touch sensing assembly and a display panel. The touch sensing assembly may be disposed on one side of the display panel to form an out-cell touch sensing display device. The touch sensing assembly can also be disposed in the display panel to form an in-cell touch sensing display device. The display panel may be a liquid crystal display panel or an organic light-emitting diode display panel. Hereinafter, the present application will be described by taking the organic light-emitting diode display panel as an example.

The touch sensing display device 100 includes a display panel, a touch sensing assembly, a polarizer 60 and a protective cover 70 that are sequentially stacked. The display panel includes a substrate 10, a thin-film transistor array layer 20, an organic light-emitting diode array layer 30, and an encapsulation layer 40 that are sequentially stacked. The touch sensing assembly includes a touch sensing layer 50. The encapsulation layer 40 is located between the organic light-emitting diode array layer 30 and the touch sensing assembly.

The substrate 10 is a flexible substrate, and the substrate 10 serves as a carrier to provide a supporting surface for a layer such as the thin-film transistor array layer 20 and so on. The substrate 10 may be a glass substrate or the like.

The thin-film transistor array layer 20 includes a plurality of thin-film transistors arranged in an array. The thin-film transistor is configured to control a working state of the organic light-emitting diode in the organic light-emitting diode array layer 30. The thin-film transistor may be at least one of an amorphous silicon thin-film transistor, a polysilicon thin-film transistor, or a metal oxide thin-film transistor.

The organic light-emitting diode array layer 30 includes a plurality of organic light-emitting diodes arranged in an array. The plurality of organic light-emitting diodes arranged in an array includes a plurality of independent anodes, organic light-emitting units corresponding to the anodes, and a common cathode. The plurality of organic light-emitting diodes arranged in an array constitute a plurality of sub-pixels of the organic light-emitting diode display panel, and one of the organic light-emitting diodes corresponds to one of the sub-pixels. The plurality of sub-pixels includes a red sub-pixel R, a blue sub-pixel B, and a green sub-pixel G. A shape of each of the sub-pixels may be a square, a rectangle, or a diamond. The shape of each of the sub-pixels may also be an ellipse or a quadrilateral with recessed arc-shaped edges. A size of each of the sub-pixels is several tens of micrometers.

The encapsulation layer 40 may be a thin-film encapsulation layer. The thin-film encapsulation layer includes two inorganic layers and an organic layer located between the two inorganic layers. The inorganic layer is formed by chemical sputtering deposition, and the organic layer is formed by coating or the like. A thickness of the film encapsulation layer ranges from 3 micrometers to 10 micrometers, for example, 5 micrometers, 6 micrometers, or 8 micrometers. Material of the inorganic layer is selected from silicon nitride or silicon oxide, and material of the organic layer is selected from polyimide and the like. The encapsulation layer 40 may also be a glass encapsulation cover plate.

The polarizer 60 is configured to reduce reflectivity of ambient light in the touch sensing display device, so as to improve contrast during display of the touch sensing display device. The protective cover plate 70 is configured to protect a layer such as the polarizer 60 or the like. The protective cover plate 70 is a transparent polyimide layer or a glass protective cover plate.

Figure 2:
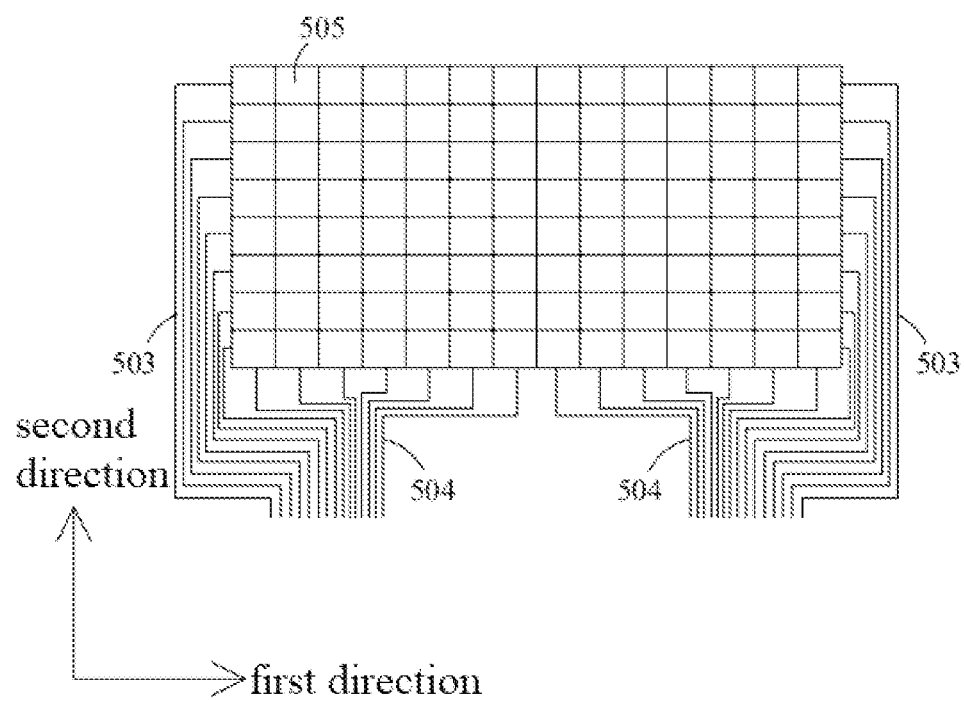
FIG. 2 is a schematic diagram of a driving structure of the touch sensing layer of the touch sensing display device according to the present application.
Figure 3:
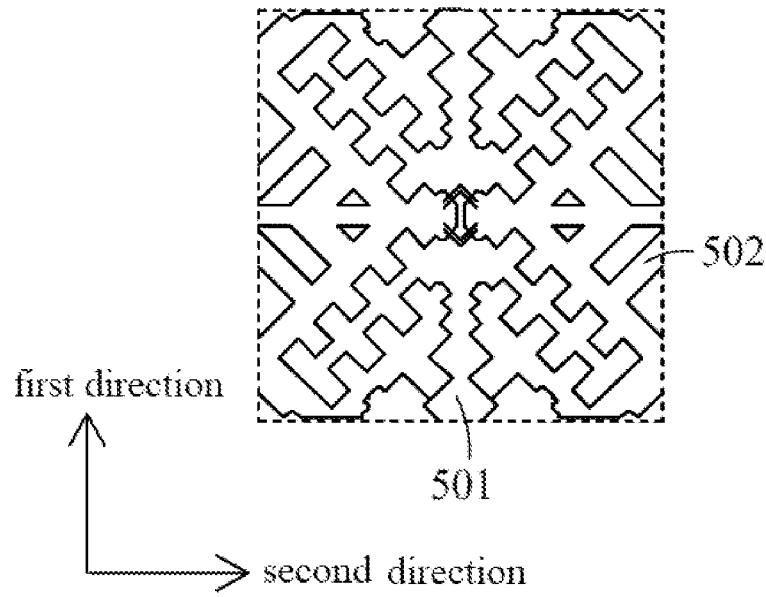
FIG. 3 is a first schematic diagram of the touch sensing unit shown in FIG. 2.
Figure 4:
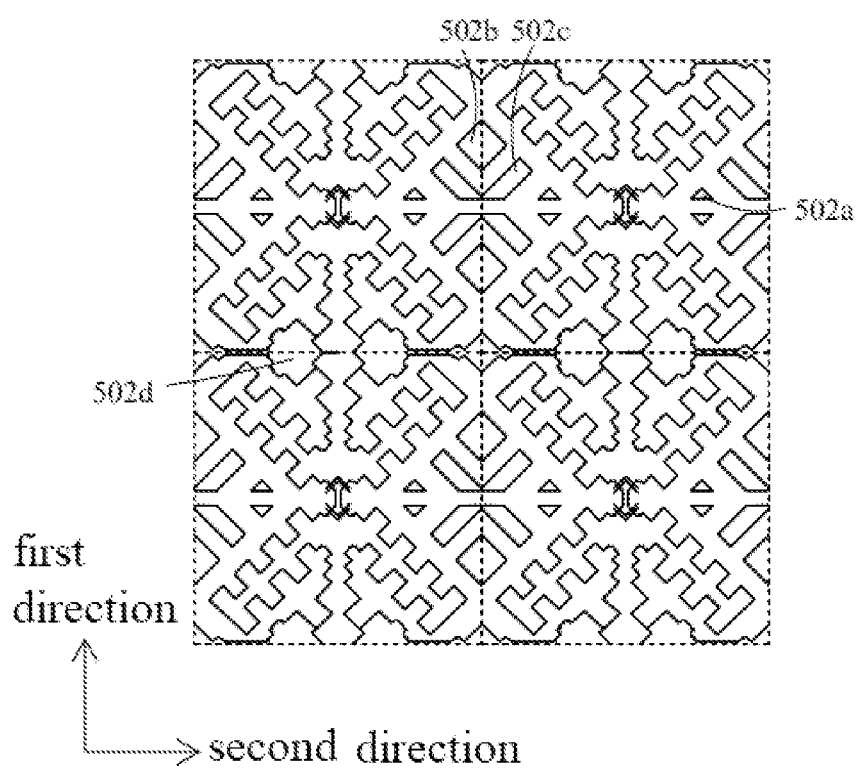
FIG. 4 is a schematic diagram of a plurality of touch sensing units arranged in an array shown in FIG. 3.

Referring to FIG. 2 to FIG. 4, FIG. 2 is a schematic diagram of a driving structure of the touch sensing layer of the touch sensing display device according to the present application; FIG. 3 is a first schematic diagram of the touch sensing unit shown in FIG. 2; and FIG. 4 is a schematic diagram of the touch sensing units arranged in an array.

The touch sensing layer 50 includes a plurality of first touch sensing electrodes 501 electrically connected to each other in a first direction and a plurality of second touch sensing electrodes 502 electrically connected to each other in a second direction. The first touch sensing electrodes 501 and the second touch sensing electrodes 502 are electrically insulated from each other, and the first direction is perpendicular to the second direction. A plurality of first touch sensing electrodes 501 electrically connected to each other in the first direction and arranged in a same row form a first touch sensing electrode channel, and a plurality of first touch sensing electrode channels are arranged along the second direction. A plurality of second touch sensing electrodes 502 electrically connected to each other in the second direction and arranged in the same row form a second touch sensing electrode channel, and a plurality of second touch sensing electrode channels are arranged along the first direction.

A size of the touch sensing layer 50 along the first direction is larger than a size of the touch sensing layer 50 along the second direction. A number of first touch sensing electrodes 501 on each of the first touch sensing electrode channels is greater than a number of second touch sensing electrodes 502 on each of the second touch sensing electrode channels. Impedance of each of the first touch sensing electrode channels is greater than impedance of each of the second touch sensing electrode channels. Opposite ends of each of the first touch sensing electrode channels are connected to a touch sensing chip through a first lead 503, and one end of each of the second touch sensing electrode channels is connected to the touch sensing chip through a second lead 504. The touch sensing layer of this embodiment adopts a two-transistor and one-resistor (2T1R) architecture to reduce a load required by the touch sensing chip to drive each of the first touch sensing electrode channels, which can effectively increase the sensing frequency and the touch sensing report rate.

As shown in FIG. 2 and FIG. 4, the touch sensing layer includes a plurality of touch sensing units 505 arranged in an array. Each of the touch sensing units 505 is square. As shown in FIG. 3, each of the touch sensing units 505 includes a first touch sensing electrode 501 and a second touch sensing electrode 502, and the second touch sensing electrode 502 in a same one of the touch sensing units 505 surrounds the first touch sensing electrode 501.

Figure 5:
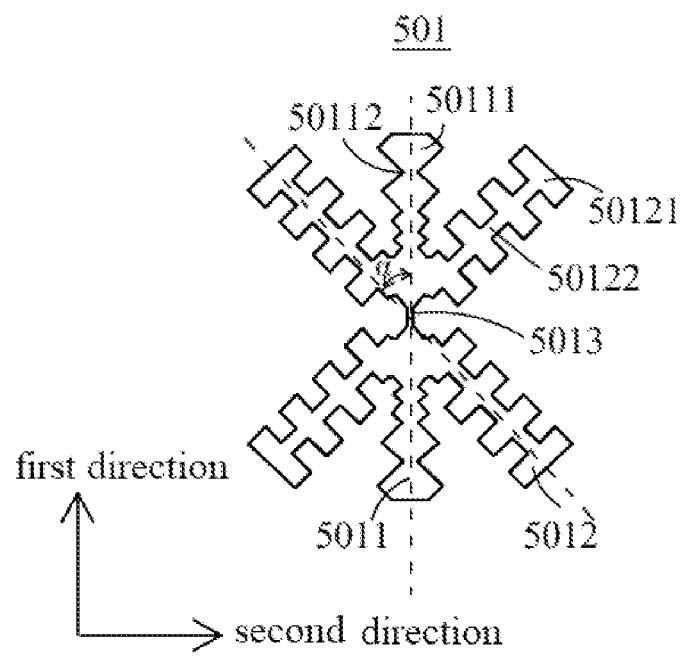
FIG. 5 is a schematic diagram of a first touch sensing electrode of the touch sensing unit shown in FIG. 3.

As shown in FIG. 5, it is a schematic diagram of the first touch sensing electrode of the touch sensing unit shown in FIG. 3. The first touch sensing electrode 501 is arranged along the first direction. The first touch sensing electrode 501 includes a first main electrode 5011 arranged along a first direction and at least one first branch electrode 5012, and the at least one first branch electrode 5012 is electrically connected to the first main electrode 5011.

An end of the first branch electrode 5012 is electrically connected to an intersection between the first main electrode 5011 and the second main electrode 5021, and an included angle α between the first branch electrode 5012 and the first main electrodes 5011 satisfies 0°<α<90°. For example, the included angle α is 30 degrees, 50 degrees, 60 degrees, or 80 degrees. Specifically, the included angle α between the first branch electrode 5012 and the first main electrode 5011 is 45 degrees. Two first branch electrodes 5012 extend from one end of the first main electrode 5011 at the intersection between the first main electrode 5011 and the second main electrode 5021, and the two first branch electrodes 5012 are symmetrically arranged with respect to the first main electrode 5011.

Each of the first main electrode 5011 includes a plurality of first widened portions 50111 and a first connecting portion 50112 electrically connected to the first widened portions 50111. In the first main electrode 5011, a width of each of the first widened portions 50111 close to an intersection between the first branch electrode 5012 and the first main electrode 5011 is smaller than a width of each of the first widened portions 50111 away from the intersection between the first branch electrode 5012 and the first main electrode 5011, to achieve that a distance between the first main electrode 5011 and the first widened portions 50111 close to the intersection between the first branch electrode 5012 and the first main electrode 5011 is smaller than a distance between the first main electrode 5011 and the first widened portions 50111 away from the intersection between the first branch electrode 5012 and the first main electrode 5011, which can prevent a part of the second branch electrode 5022 between the first branch electrode 5012 and the first main electrode 5011 from interruption with the other part of the second branch electrode 5022 caused by the smaller distance between the first branch electrode 5012 and the first main electrode 5011, and such interruption causes the mutual capacitance between the first touch sensing electrode 501 and the second touch sensing electrode 502 to decrease.

In this embodiment, each of the second branch electrodes 5022 surrounds one side of the first main electrode 5011. The first widened portions 50111 are matched and conformal with parts of the second branch electrodes 5022 corresponding to the first widened portions 50111, and the first connecting portions 50112 are matched and conformal with parts of the second branch electrode 5022 corresponding to the first connecting portions 50112, such that a boundary between the first main electrode 5011 and the second branch electrode 5022 is increased, and thus the mutual capacitance between the first touch sensing electrode 501 and the second touch sensing electrode 502 is further increased. Each of the first widened portions 50111 has a diamond shape. The first main electrode 5011 is not hollowed out. Since the impedance of each of the first touch sensing electrode channels is determined by the impedance of the first main electrode 5011 along the longitudinal axis, the non-hollowed-out first main electrode 5011 can maximize the reduction in impedance of the first touch sensing electrode 501.

Figure 6:
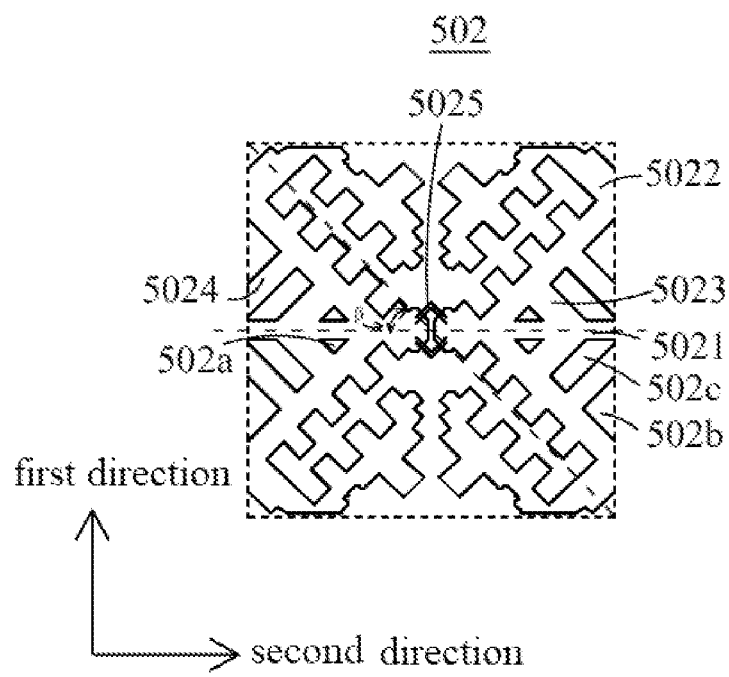
FIG. 6 is a schematic diagram of a second touch sensing electrode of the touch sensing unit shown in FIG. 3.

As shown in FIG. 6, it is a schematic diagram of the second touch sensing electrode of the touch sensing unit shown in FIG. 3. The second touch sensing electrode 502 is arranged along the second direction. The second touch sensing electrode 502 includes a second main electrode 5021, at least one second branch electrode 5022, and at least one first connecting branch electrode 5023 arranged along the second direction. One end of the second branch electrode 5022 is electrically connected to the second main electrode 5021, opposite ends of the first connecting branch electrode 5023 are respectively electrically connected to the second branch electrode 5022 and the second main electrode 5021, and the second branch electrode 5022 surrounds a corresponding one of the first branch electrode 5012.

Compared with the traditional technology, by adding the first connecting branch electrode 5023 between the second branch electrode 5022 and the second main electrode 5021, the transmission channels of the current on the second touch sensing electrode 502 is increased, and the resistance of the second touch sensing electrode 502 in the touch sensing unit 505 is reduced, thereby reducing the resistance of the entire second touch sensing electrode channels, thus beneficial to improve the touch sensing report rate. In addition, the second branch electrode 5022 surrounds the first branch electrode 5012 to increase the mutual capacitance between the first touch sensing electrode 501 and the second touch sensing electrode 502, such that touch sensing sensitivity is improved, further improving touch sensing performance.

An end of the second branch electrode 5022 is electrically connected to an intersection between the second main electrode 5021 and the first main electrode 5011, and an included angle β between the second branch electrode 5022 and the second main electrode 5021 satisfies 0°<β<90°. For example, the included angle β is 30 degrees, 40 degrees, 50 degrees, or 80 degrees. Specifically, the angle between the second branch electrode 5022 and the second main electrode 5021 is 45 degrees.

In this embodiment, the first branch electrode 5012 includes a plurality of second widened portions 50121 and second connecting portions 50122 electrically connected to the second widened portions 50121, and the second branch electrode 5022 surrounds corresponding ones of the second widened portions 50121 and the second connecting portions 50122. The second branch electrode 5022 surrounds the first branch electrode 5012, so that there is a long boundary between the second branch electrode 5022 and the first branch electrode 5012, and the mutual capacitance between the first branch electrode 5012 and the second branch electrode 5022 is larger, and meanwhile, the mutual capacitance electric field lines are distributed more uniformly, which is more conducive to improving the resolution and accuracy of detecting the touch sensing position. In addition, the second widened portions 50121 and the second connecting portion 50122 of the first branch electrode 5012 are matched and conformal with parts of the second branch electrodes 5022 corresponding to the second widened portions 50121, and the first connecting portions 50112 are matched and conformal with the second branch electrode 5022, to further increase the boundary between the first branch electrode 5012 and the second branch electrode 5022, and thus, the mutual capacitance between the first touch sensing electrode 501 and the second touch sensing electrode 502 is further increased.

In this embodiment, the shape of each of the second widened portions 50121 is rectangular. Compared with one second widened portion 50121, the plurality of second widened portions 50121 can increase the mutual capacitance between the first branch electrode 5012 and the second branch electrode 5022. Each of the second widened portions 50121 is rectangular, such that, compared with each of the second widened portions 50121 having a shape of square, more second widened portions 50121 can be provided on each of the first branch electrodes 5012, The mutual capacitance between the first branch electrode 5012 and the second branch electrode 5022 can be further increased. A number of the second widened portions 50121 is greater than two, and the top end of the first branch electrode 5012 away from the first main electrode 5011 is provided with a second widened portion 50121. In a width direction of the first branch electrode 5012, the first branch electrode 5012 surrounds at least two of the sub-pixels.

In this embodiment, the first touch sensing electrode 501 and the second main electrode 5021 are symmetrically disposed with respect to the first main electrode 5011 and the second main electrode 5021, and the second touch sensing electrode 502 and the second main electrode 5021 are disposed symmetrically with respect to the first main electrode 5011. In the same touch sensing unit 505, parts of the first main electrodes 5011 disposed on opposite sides of the intersection between the first main electrode 5011 and the second main electrode 5021 are connected to each other by a third connecting portion 5013, and the second main electrodes 5021 disposed on opposite sides of the intersection between the first main electrode 5011 and the second main electrode 5021 are connected by a fourth connecting portion 5025. The third connecting portion 5013 and the first main electrode 5011 are continuously formed. The fourth connecting portion 5025 includes two connecting bridges that are not connected to each other. The third connecting portion 5013 and the fourth connecting portion 5025 are insulated from each other.

In this embodiment, in a same one of the touch sensing units 505, a first hollow portion 502a is defined in a first region surrounded by corresponding ones of the first connecting branch electrode 5023, the second main electrode 5021. The first hollow portion 502a is provided in the first area to reduce the parasitic capacitance between the second touch sensing electrode 502 and a common cathode. The shape of the first hollow portion 502a is a triangle. The first hollow portion 502a is arranged along an edge of the second main electrode 5021 parallel to the second direction.

In this embodiment, the second touch sensing electrode 502 further includes a second connecting branch electrode 5024. One end of the second connecting branch electrode 5024 is electrically connected to a corresponding one of the second branch electrode 5022, and an opposite end of the second connecting branch electrode 5024 is electrically connected to an end of another second connecting branch electrode 5024 in an adjacent one of the touch sensing units 505 in the second direction, to increase the transmission channels of current between the two second touch sensing electrodes 502 in the adjacent ones of the touch sensing units 505, and to reduce the impedance of the second touch sensing electrode channel, thereby improving the touch sensing report rate.

In adjacent ones of the touch sensing units 505 along the second direction, a second hollow portion 502b is defined in a second region surrounded by corresponding ones of the second connecting branch electrode 5024 and the second branch electrode 5022, to further reduce the parasitic capacitance between the second touch sensing electrode 502 and the common cathode, and reduce the influence of the parasitic capacitance on the touch sensing performance. The second hollow portion 502b has a rhombus shape.

In this embodiment, an end of the second branch electrode 5022 away from an opposite end of the second branch electrode 5022 connected to the second main electrode 5021 is electrically connected to an end of another second branch electrode 5022 in an adjacent one of the touch sensing units 505 in the second direction, so that the second branch electrodes 5022 in adjacent ones of the touch sensing units 505 are continuously conducted, and the resistance of the second touch sensing electrode channel is reduced, thereby improving the touch sensing report rate.

In this embodiment, in a same one of the touch sensing units 505, a third hollow portion 502c is defined in a third region surrounded by corresponding ones of the first connecting branch electrode 5023, the second connecting branch electrode 5024, the second main electrode 5021, and the second branch electrode 5022, such that, by adding the third hollow portion 502c, the parasitic capacitance between the second touch sensing electrode 502 and the common cathode can be further reduced.

In this embodiment, the first hollow portion 502a, the second hollow portion 502b, and the third hollow portion 502c are spaced apart from each other and arranged in parallel to each other to reduce the parasitic capacitance of the second touch sensing electrode 502. Meanwhile, the first connecting branch electrodes 5023 between the first hollow portion 502a and the third hollow portions 502c remain, and the second connecting branch electrodes 5024 between the second hollow portions 502b and the third hollow portions 502c remain, which increases a distribution area of the branch electrodes of the second touch sensing electrodes 502, and increases the uniformity of the mutual capacitance distribution of the first touch sensing electrode 501 and the second touch sensing electrode 502 during touch sensing, so as to avoid excessive hollowed area which causes the mutual capacitance not to form here. In addition, the first hollow portion 502a, the second hollow portion 502b, and the third hollow portion 502c are disposed on one side of the first main electrode 5021, and disposing the hollow portions in a partial area of the branch electrode of the second touch electrode 502 reduces the parasitic capacitance of the second touch electrode 502 while avoiding the risk of increasing the impedance of the second touch electrode channel, compared with the case that the hollow portions are disposed on the second main electrode 5021, resulting in an increase in the impedance of the second main electrode 5021.

In this embodiment, in adjacent ones of the touch sensing units 505 along the first direction, a fourth hollow portion 502d is defined in a fourth region surrounded by corresponding ones of the second branch electrode 5022 and the first main electrode 5011, and a fourth dummy electrode 5064 is disposed in the fourth hollow portion 502d. In the first direction, the fourth dummy electrode 5064 surrounds at least one of the sub-pixels to avoid short-circuiting of the second touch sensing electrode 502 in the first direction.

Figure 7:
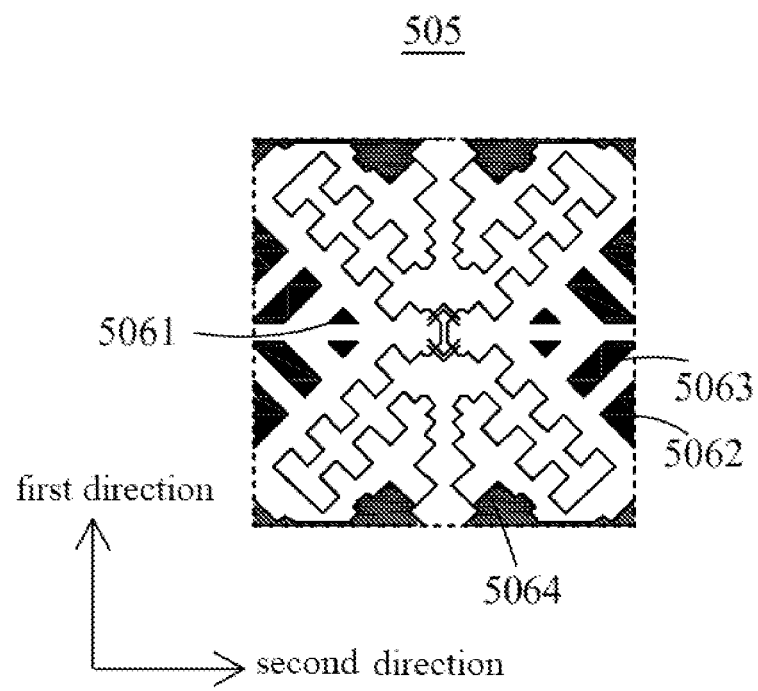
FIG. 7 is a second schematic diagram of the touch sensing unit shown in FIG. 2.

In this embodiment, the first dummy electrode 5061, the second dummy electrode 5062, the third dummy electrode 5063, and the fourth dummy electrode 5064 are all electrically insulated from the first touch sensing electrode 501 and the second touch sensing electrode 502, and a first dummy electrode 5061, a second dummy electrode 5062, a third dummy electrode 5063, the fourth dummy electrode 5064, the first touch sensing electrode 501, and the second touch sensing electrode 502 are all composed of the same layer of metal mesh. The first dummy electrode 5061, the second dummy electrode 5062, the third dummy electrode 5063, and the fourth dummy electrode 5064 are electrically insulated from the first touch sensing electrode 501 and the second touch sensing electrode 502 by disconnection of a metal mesh. As shown in FIG. 7, which is a second schematic diagram of the touch sensing unit according to an embodiment of the present application, the first dummy electrode 5061 is disposed in the first hollow portion 502a, the second dummy electrode 5062 is disposed in the second hollow portion 502b, the third dummy electrode 5063 is disposed in the third hollow portion 502c, and the fourth dummy electrode 5064 is disposed in the fourth hollow portion 502d. The first dummy electrode 5061, the second dummy electrode 5062, the third dummy electrode 5063, and the fourth dummy electrode 5064 are all configured to improve the optical uniformity when light passes through the touch sensing layer. In addition, the fourth dummy electrode 5064 is configured to electrically insulate the second touch sensing electrodes 502 of adjacent ones of the touch sensing units 505 in the first direction.

In this embodiment, in one of the touch sensing units 505, an end of the second branch electrode 5022 away from the second main electrode 5021 is insulated from an end of another adjacent second branch electrode 5022 in an adjacent one of the touch sensing units 505 in the first direction, so as to avoid short-circuiting of the second branch electrode 5022 in the first direction.

In this embodiment, the first connecting branch electrode 5023 is disposed corresponding to the second widened portions 50121 of the first branch electrode 5012 adjacent to the first connecting branch electrode 5023, and the second connecting branch electrode 5024 is disposed corresponding to the second widened portions 50121 of the first branch electrode 5012 adjacent to the second connecting branch electrode 5024, so that mutual capacitance is formed between the first connecting branch electrode 5023 and the corresponding ones of the second widened portions 50121 of the first branch electrode 5012 and formed between the second connecting branch electrode 5024 and the corresponding ones of the second widened portions 50121 of the first branch electrode 5012.

The first hollow portion 502a is disposed corresponding to the second connecting portion 50122 of the first branch electrode 5012 adjacent to the first hollow portion 502a, and the third hollow portion 502c is disposed corresponding to the second connecting portion 50122 of the second branch electrode 5012 adjacent to the third hollow portion 502c, so that a part of the second branch electrode 5022 corresponding to a portion between the first hollow portion 502a and the second connecting portion 50122 of the first branch electrode 5012 adjacent to the first hollow portion 502a form a mutual capacitance with the second connecting portion 50122, and a part of the second branch electrode 5022 corresponding to a portion between the third hollow portion 502c and the second connecting portion 50122 of the first branch electrode 5012 adjacent to the third hollow portion 502c and form a mutual capacitance with the second connecting portion 50122.

In the width direction of the second branch electrode 5022, the second branch electrode 5022 corresponding to the portion between the first hollow portion 502a, the second hollow portion 502b, and the third hollow portion 502c and the first branch electrode 5012, surrounds two to three of the sub-pixels, and the redundant second branch electrode 5022 is removed, to reduce the parasitic capacitance of the second touch sensing electrode 502, such that a balance between increasing the mutual capacitance between the first touch electrode 501 and the second touch electrode 502 and reducing the parasitic capacitance of the second touch electrode 502 is achieved.

In this embodiment, the first touch sensing electrode 501 and the second touch sensing electrode 502 are composed of metal meshes. Material of the metal mesh is selected from at least one of Ti, Al, Mo, Ag, or Au. An orthographic projection of the metal mesh on a plane of the sub-pixels is located at a periphery of the sub-pixels. It can be understood that material of the first touch sensing electrode 501 and the second touch sensing electrode 502 may also be indium tin oxide. When the first touch sensing electrode 501 and the second touch sensing electrode 502 are made of indium tin oxide, the first touch sensing electrode 501 and the second touch sensing electrode 502 are patterned indium tin oxide layers.

Figure 8A:
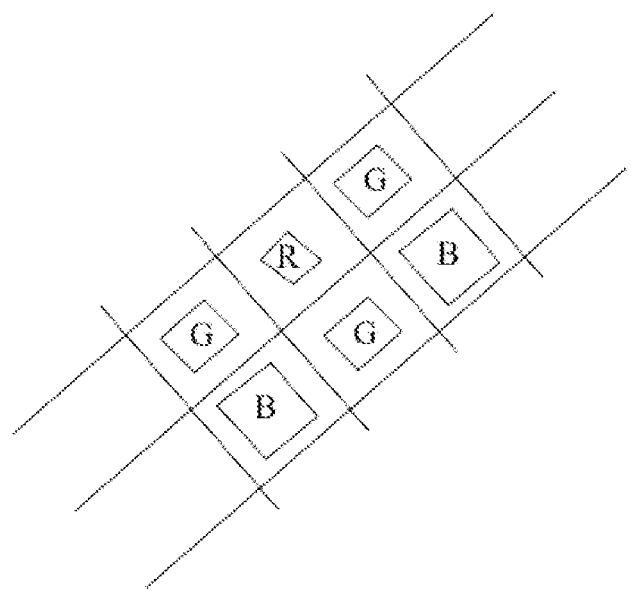
FIG. 8A is a first schematic diagram of a metal mesh surrounding sub-pixels.

As shown in FIG. 8A, it is a first schematic diagram of a metal mesh surrounding sub-pixels. This design is suitable for a case that edges of the sub-pixels are straight, for example, the sub-pixels are rectangular, diamond, etc., and correspondingly, the metal mesh is also straight. Sub-pixels having shapes such as rectangles and diamonds are surrounded by a square metal mesh, and one mesh of the metal mesh surrounds one of the sub-pixels. Since the sub-pixels is designed to arrange with a 45-degree tilt, in order to prevent the metal mesh from shielding the light emitted by the sub-pixels, metal lines constituting the metal mesh also need to be designed with a 45-degree tilt.

Figure 8B:
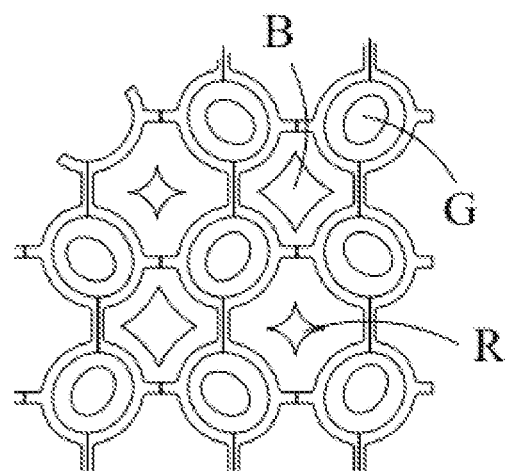
FIG. 8B is a second schematic diagram of a sub-pixel surrounded by a metal mesh.

As shown in FIG. 8B, it is a second schematic diagram of a metal mesh surrounding sub-pixels. This design is suitable for a case that edges of the sub-pixels are arc-shaped, for example, the sub-pixels are elliptical and quadrilaterals with recessed arc-shaped edges, etc. The elliptical sub-pixels are surrounded by an elliptical metal mesh, and the quadrilateral sub-pixels with the recessed arc-shaped edges the edge are surrounded by an octagonal metal mesh. Four elliptical sub-pixels surround a quadrilateral sub-pixel with the recessed arc-shaped edges.

Through simulation, the mutual capacitance of the touch sensing unit composed of the first touch sensing electrode 501 and the second touch sensing electrode 502 in this embodiment applied to a non-foldable touch sensing display device is 0.07 picofarad. The first branch electrode 5012 only extends from opposite side of one end of the first main electrode 5011, so that the touch sensing electrode composed of the first touch sensing electrode 501 and the second touch sensing electrode 502 is more suitable for a plane sensing display device or a touch sensing display device with a non-foldable arc. Compared with the touch sensing electrodes with two or more first branch electrodes extending from one side of each first main electrode which are only suitable for dynamically foldable screens, because the non-foldable touch sensing display devices have relatively thick modules, the touch sensing electrodes with two or more first branch electrodes extending from one side of each first main electrode are not suitable for a plane sensing display device or a touch sensing display device with a non-foldable arc. In addition, the design solution of the touch sensing assembly of the present application can avoid a decreased sensing frequency of the touch sensing screen caused by insufficient charging of the touch sensing electrode due to the excessively large resistive-capacitive delay (RC delay) of the touch sensing screen under the premise of increasing the signal volume during touch sensing by a finger. (Sensing Frequency), thereby avoiding impacting on key indicators touch sensing performance such as a reporting rate.

The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A touch sensing assembly, comprising a touch sensing layer, wherein the touch sensing layer comprises a plurality of touch sensing units, and each of the touch sensing units comprises:
   a first touch sensing electrode arranged along a first direction, the first touch sensing electrode comprising: a first main electrode arranged along the first direction and at least one first branch electrode, wherein an end of the first branch electrode is electrically connected to the first main electrode;
   a second touch sensing electrode arranged along a second direction, the second touch sensing electrode comprising: a second main electrode arranged along the second direction, at least one second branch electrode, and at least one first connecting branch electrode, wherein an end of the second branch electrode is electrically connected to the second main electrode, opposite ends of the first connecting branch electrode are respectively electrically connected to the second branch electrode and the second main electrode, the second branch electrode surrounds corresponding one of the at least one first branch electrode, and the first direction is different from the second direction,
   wherein in a same one of the touch sensing units, a first hollow portion is defined in a first region surrounded by corresponding ones of the first connecting branch electrode, the second main electrode, and the second branch electrode, and a first dummy electrode is disposed in the first hollow portion.

2. The touch sensing assembly according to claim 1, wherein the second touch sensing electrode in one of the touch sensing units further comprises: a second connecting branch electrode, one end of the second connecting branch electrode is electrically connected to a corresponding one of the second branch electrode, and an opposite end of the second connecting branch electrode is electrically connected to an end of another second connecting branch electrode in an adjacent one of the touch sensing units in the second direction.

3. The touch sensing assembly according to claim 2, wherein, in adjacent ones of the touch sensing units along the second direction, a second hollow portion is defined in a second region surrounded by corresponding ones of the second connecting branch electrode and the second branch electrode, and a second dummy electrode is disposed in the second hollow portion.

4. The touch sensing assembly according to claim 3, wherein an end of the second branch electrode away from an opposite end of the second branch electrode connected to the second main electrode is electrically connected to an end of another second branch electrode in an adjacent one of the touch sensing units in the second direction.

5. The touch sensing assembly according to claim 2, wherein in a same one of the touch sensing units, a third hollow portion is defined in a third region surrounded by corresponding ones of the first connecting branch electrode, the second connecting branch electrode, the second main electrode, and the second branch electrode, and a third dummy electrode is disposed in the third hollow portion.

6. The touch sensing assembly according to claim 1, wherein, in adjacent ones of the touch sensing units along the first direction, a fourth hollow portion is defined in a fourth region surrounded by corresponding ones of the second branch electrode and the first main electrode, and a fourth dummy electrode is disposed in the fourth hollow portion.

7. The touch sensing assembly according to claim 6, wherein an end of the second branch electrode away from the second main electrode is insulated from an end of another adjacent second branch electrode in an adjacent one of the touch sensing units in the first direction.

8. The touch sensing assembly according to claim 1, wherein the first main electrode comprises: a plurality of first widened portions and a plurality of first connecting portions electrically connected to the first widened portions;
   the first branch electrode comprises: a plurality of second widened portions and a plurality of second connecting portions electrically connected to the second widened portions; and
   the second branch electrode surrounds corresponding ones of the second widened portions and corresponding ones of the second connecting portions.

9. The touch sensing control assembly according to claim 8, wherein, in the first main electrode, a width of each of the first widened portions close to an intersection between the first branch electrode and the first main electrode is smaller than a width of each of the first widened portions away from the intersection between the first branch electrode and the first main electrode.

10. The touch sensing assembly according to claim 8, wherein the first connecting branch electrode is disposed corresponding to one of the second widened portions of the first branch electrode adjacent to the first connecting branch electrode.

11. The touch sensing assembly according to claim 1, wherein one end of the first branch electrode is electrically connected to an intersection between the first main electrode and the second main electrode, and an included angle α between the first branch electrode and the first main electrodes satisfies 0°<α<90°; and
   an end of the second branch electrode is electrically connected to an intersection between the second main electrode and the first main electrode, and an included angle β between the second branch electrode and the second main electrode satisfies 0°<β<90°.

12. The touch sensing assembly according to claim 11, wherein the first direction is perpendicular to the second direction, and the included angle α between the first branch electrode and the first main electrode is 45°, the included angle β between the second branch electrode and the second main electrode is 45°.

13. The touch sensing assembly according to claim 1, wherein the first touch sensing electrode is mirror-symmetrical with respect to the first main electrode, and the second touch sensing electrode is mirror-symmetrical with respect to the second main electrode.

14. The touch sensing control assembly according to claim 1, wherein parts of the first main electrode located on opposite sides of the intersection between the first main electrode and the second main electrode are connected to each other by a third connecting portion;
   parts of the second main electrode located on opposite sides of the intersection between the first main electrode and the second main electrode are connected to each other by a fourth connecting portion; and
   the fourth connecting portion comprises two connecting bridges that are not connected to each other, and the third connecting portion is insulated from the fourth connecting portion.

15. A touch sensing display device, comprising the touch sensing assembly according to claim 1 and a display panel, wherein touch sensing assembly is located on one side of the display panel, the display panel comprises an organic light-emitting diode array layer and an encapsulation layer, and the encapsulation layer is located between the organic light-emitting diode array layer and the touch sensing assembly.

16. A touch sensing assembly, comprising a touch sensing layer, wherein the touch sensing layer comprises a plurality of touch sensing units, and each of the touch sensing units comprises:
  a first touch sensing electrode arranged along a first direction, the first touch sensing electrode comprising: a first main electrode arranged along the first direction and at least one first branch electrode, wherein an end of the first branch electrode is electrically connected to the first main electrode;
  a second touch sensing electrode arranged along a second direction, the second touch sensing electrode comprising: a second main electrode arranged along the second direction, at least one second branch electrode, and at least one first connecting branch electrode, wherein an end of the second branch electrode is electrically connected to the second main electrode, opposite ends of the first connecting branch electrode are respectively electrically connected to the second branch electrode and the second main electrode, the second branch electrode surrounds corresponding one of the at least one first branch electrode, and the first direction is different from the second direction, wherein the second touch sensing electrode in one of the touch sensing units further comprises: a second connecting branch electrode, one end of the second connecting branch electrode is electrically connected to a corresponding one of the second branch electrode, and an opposite end of the second connecting branch electrode is electrically connected to an end of another second connecting branch electrode in an adjacent one of the touch sensing units in the second direction, wherein in a same one of the touch sensing units, a third hollow portion is defined in a third region surrounded by corresponding ones of the first connecting branch electrode, the second connecting branch electrode, the second main electrode, and the second branch electrode, and a third dummy electrode is disposed in the third hollow portion.

* * * * *